United States Patent
Shim et al.

(10) Patent No.: US 7,468,295 B2
(45) Date of Patent: Dec. 23, 2008

(54) METHOD OF FABRICATING T-GATE

(75) Inventors: Jae Yoeb Shim, Daejeon (KR); Hyung Sup Yoon, Daejeon (KR); Dong Min Kang, Daejeon (KR); Ju Yeon Hong, Seoul (KR); Kyung Ho Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 202 days.

(21) Appl. No.: 11/607,417

(22) Filed: Dec. 1, 2006

(65) Prior Publication Data

US 2007/0128752 A1  Jun. 7, 2007

(30) Foreign Application Priority Data

Dec. 7, 2005  (KR) ............... 10-2005-0119004

(51) Int. Cl.
*H01L 21/338* (2006.01)
(52) U.S. Cl. .................. 438/182; 438/574
(58) Field of Classification Search .......... 438/183, 438/574

See application file for complete search history.

(56) References Cited

U.S. PATENT DOCUMENTS 6,524,937 B1  2/2003  Cheng et al.
6,943,068 B2  9/2005  Chang et al.
7,413,942 B2*  8/2008  Pellens et al. ............ 438/182
2006/0105531 A1  5/2006  Huh

FOREIGN PATENT DOCUMENTS

| JP | 11-288950 | 10/1999 |
|---|---|---|
| JP | 2001-053083 | 2/2001 |
| KR | 1019950005489 | 5/1995 |
| KR | 1019970011618 | 7/1997 |
| KR | 10-0141340 | 3/1998 |
| KR | 1020030064958 | 8/2003 |
| KR | 10-0592765 | 6/2006 |

* cited by examiner

*Primary Examiner*—Jack Chen
(74) *Attorney, Agent, or Firm*—Ladas & Parry LLP

(57) ABSTRACT

A method of fabricating a T-gate is provided. The method includes the steps of: forming a photoresist layer on a substrate; patterning the photoresist layer formed on the substrate and forming a first opening; forming a first insulating layer on the photoresist layer and the substrate; removing the first insulating layer and forming a second opening to expose the substrate; forming a second insulating layer on the first insulating layer; removing the second insulating layer and forming a third opening to expose the substrate; forming a metal layer on the second insulating layer on which the photoresist layer and the third opening are formed; and removing the metal layer formed on the photoresist layer. Accordingly, a uniform and elaborate opening defining the length of a gate may be formed by deposition of the insulating layer and a blanket dry etching process, and thus a more elaborate micro T-gate electrode may be fabricated.

7 Claims, 9 Drawing Sheets

603 605a 605

603  605

METHOD OF FABRICATING T-GATE

CROSS-REFERENCE TO RELATED APPLICATION

This application claims priority to and the benefit of Korean Patent Application No. 2005-119004, filed Dec. 7, 2005, the disclosure of which is incorporated herein by reference in its entirety.

BACKGROUND

1. Field of the Present Invention

The present invention relates to a method of fabricating a T-gate, and more particularly, to a method of fabricating a micro T-gate of a high-speed semiconductor device using a photolithography method.

2. Discussion of Related Art

High frequency characteristics of high-frequency devices such as high electron mobility transistors (HEMT) are generally affected by gate length and resistance. Accordingly, a T-gate, which is short and has a low resistance and a large cross-sectional area, has to be used to fabricate a monolithic microwave integrated circuit (MMIC) which uses a high frequency of W band (75 to 110 GHz) or more. In general, an E-beam lithography method is used to fabricate a T-gate that is short and has a large cross-sectional area. Here, a double or triple photoresist layer is used.

A conventional method of fabricating a T-gate will be described below with reference to the accompanying drawings.

FIGS. 1A to 1D are cross-sectional views illustrating a conventional method of fabricating a T-gate of a semiconductor device. First, a substrate 101 is prepared, and a first photoresist 102 is formed on the substrate 101. Then, a second photoresist 103 is formed on the first photoresist 102. The first and second photoresists 102 and 103 on the substrate 101 are formed of poly methyl methacrylate (PMMA), which can be classified according to transmissivity and loss of light. Here, the first photoresist 102 is formed of low sensitive PMMA, and the second photoresist 103 is formed of high sensitive PMMA, which is relatively more sensitive than the first photoresist 102. More specifically, the first photoresist 102 is applied and then a baking process is performed, and the second photoresist 103 is applied and then a baking process is also performed.

In the next process, referring to FIG. 1B, the second photoresist 103 is exposed (e-beam exposure) and then developed to form a head of the gate. This process is performed such that the gate head has a cross-section that is about 1 μm wide. The first photoresist 102 is patterned by an e-beam exposure process, and then a recess process is performed to form a relatively narrower gate leg than the gate head.

Referring to FIGS. 1C and 1D, a metal layer 104 is formed on the substrate 101 to form a gate electrode. The metal layer 104 is deposited on the entire surface of the exposed substrate 101 using an e-beam evaporator, and then a lift-off process is performed to remove the first and second photoresists 102 and 103. Thus, the T-gate electrode 105 is completed.

However, in the case of forming the T-gate electrode according to the conventional art, the gate may not be made shorter than the case of patterning the gate head only using the low sensitive PMMA layer. And, in exposure and development of the high sensitive PMMA, since the low sensitive PMMA layer that is under the high sensitive one is exposed, it is not easy to exactly adjust the gate length. Moreover, since the exposure and development of the photoresists use an electron beam, processing time and production cost rise.

Another method of fabricating a T-gate, which solves theses problems, is illustrated in FIGS. 2A to 2F. Referring to FIGS. 2A to 2F, a low sensitive PMMA is applied to form a first photoresist layer 202 on a substrate 201, and then a baking process is started. Then, the first photoresist layer 202 is exposed (by e-beam) and developed to form a leg of a gate. A second image reversal photoresist layer 203 is applied and then a baking process is performed. Subsequently, exposure is performed by photolithography to form a head of the gate, which has a large cross-sectional area. Then, the second image reversal photoresist layer 203 is patterned. Referring to FIG. 2E, a metal layer 204 is deposited to form a gate electrode on the substrate 201. The metal layer 204 is deposited on the entire surface of the exposed substrate 201 using an e-beam evaporator, and the first and second photoresist layers 202 and 203 are lifted off, and thus the T-gate electrode 205 is formed.

Since the method described above uses photolithography, processing time may be reduced. However, in the method, the gate leg which has a great impact on characteristics of the high frequency device is patterned first, and then the gate head is patterned by applying the image reversal photoresist layer, so a photoresist residue may remain under the patterned gate leg, which is not easy to be removed. Moreover, for this reason, the gate length may not be uniform.

SUMMARY OF THE PRESENT INVENTION

The present invention is directed to a method of fabricating a micro T-gate with a uniform and elaborate leg using a photolithography method, which may reduce processing time and production cost.

One aspect of the present invention provides a method of fabricating a T-gate comprising the steps of: forming a photoresist layer on a substrate; patterning the photoresist layer formed on the substrate and forming a first opening; forming a first insulating layer on the photoresist layer and the substrate; removing the first insulating layer and forming a second opening to expose the substrate; forming a second insulating layer on the first insulating layer; removing the second insulating layer and forming a third opening to expose the substrate; forming a metal layer on the second insulating layer on which the photoresist layer and the third opening are formed; and removing the metal layer formed on the photoresist layer.

Another aspect of the present invention provides a method of fabricating a T-gate comprising the steps of: forming a photoresist layer on a substrate; patterning the photoresist layer formed on the substrate and forming a first opening; forming a first insulating layer on the photoresist layer and the substrate; forming a second insulating layer on the first insulating layer; removing the first and second insulating layers and forming a second opening in the first opening to expose the substrate; forming a metal layer on the second insulating layer on which the photoresist layer and the second opening are formed; and removing the metal layer formed on the photoresist layer.

The step of patterning the photoresist layer may comprise the steps of exposing the photoresist layer so that the first opening has an inverse slope by a photolithography method, and developing the exposed photoresist layer. In removing the metal layer formed on the photoresist layer, the photoresist layer and the first and second insulating layers may be removed by a lift-off process. The photoresist layer may be formed of an image reversal photoresist layer. The first opening formed in the photoresist layer may be patterned to a width of about 1 μm or less. In forming the second opening in the first insulating layer, the first insulating layer may be etched by a reactive etching process. In forming the third opening in the second insulating layer, the second insulating layer may be etched by the reactive etching process. The first and second insulating layers may be removed by the reactive etching process.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the present invention are shown.

Figure 1A:
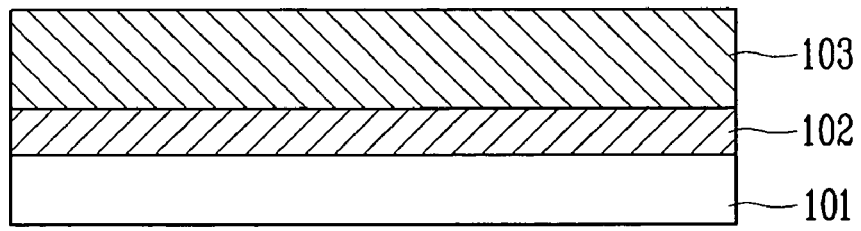
FIGS. 1A to 1D are cross-sectional views illustrating a conventional method of fabricating a T-gate of a semiconductor device.
Figure 1B:
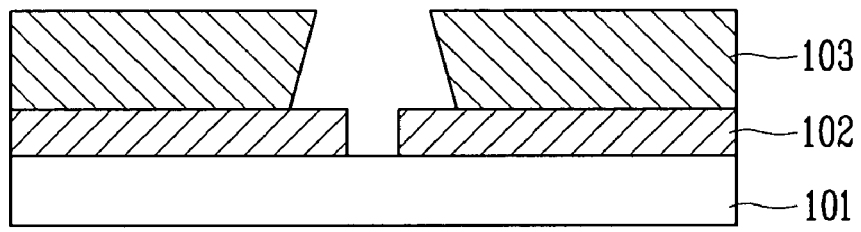
Figure 1C:
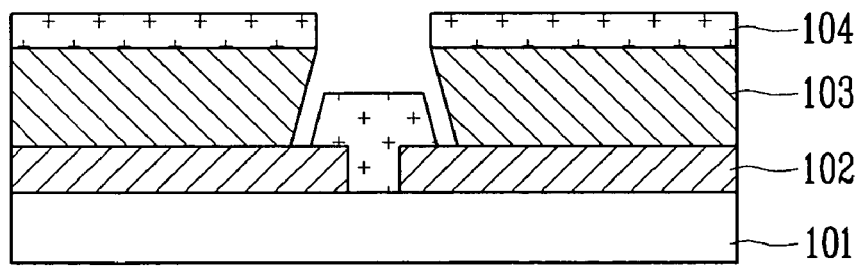
Figure 1D:
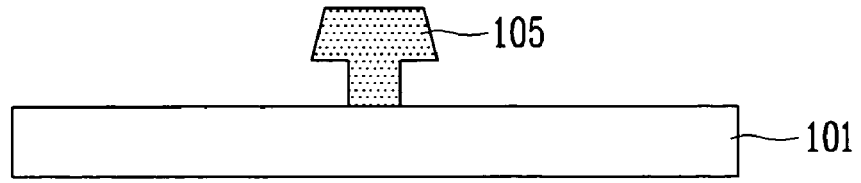
Figure 2A:
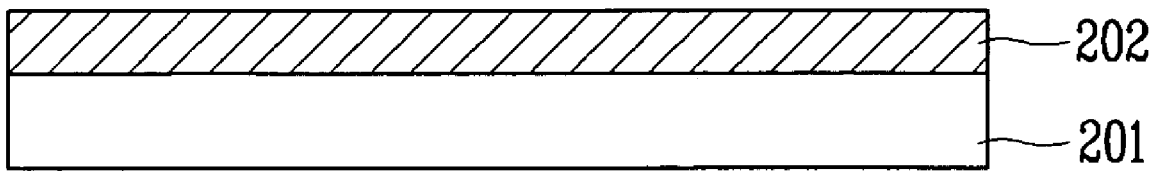
FIGS. 2A to 2F are cross-sectional views illustrating another conventional method of fabricating a T-gate of a semiconductor device.
Figure 2B:
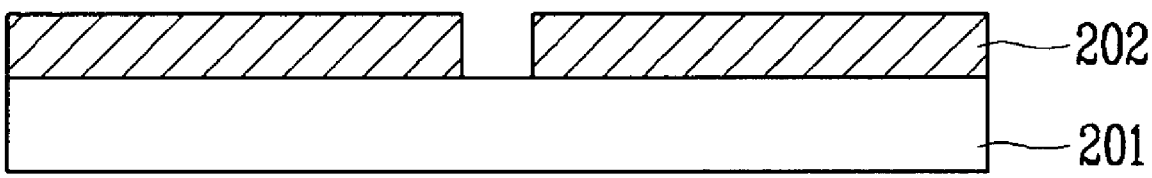
Figure 2C:
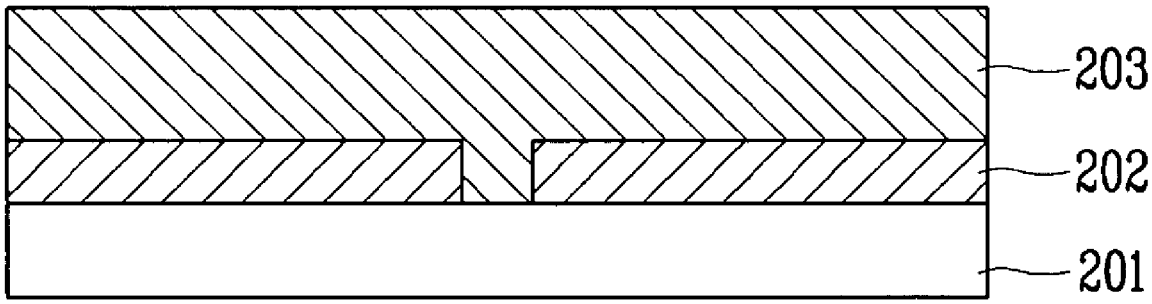
Figure 2D:
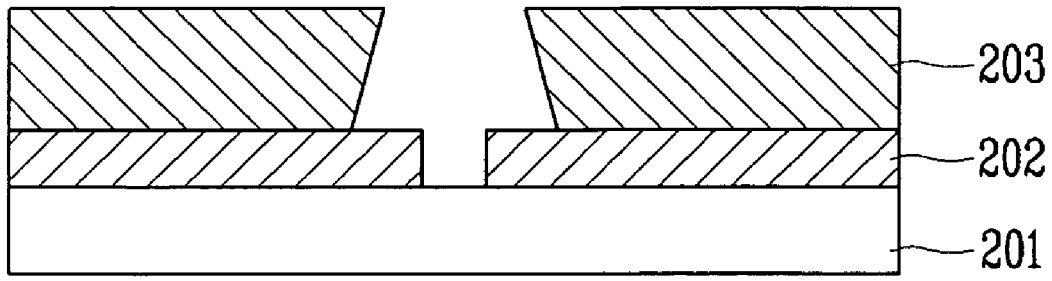
Figure 2E:
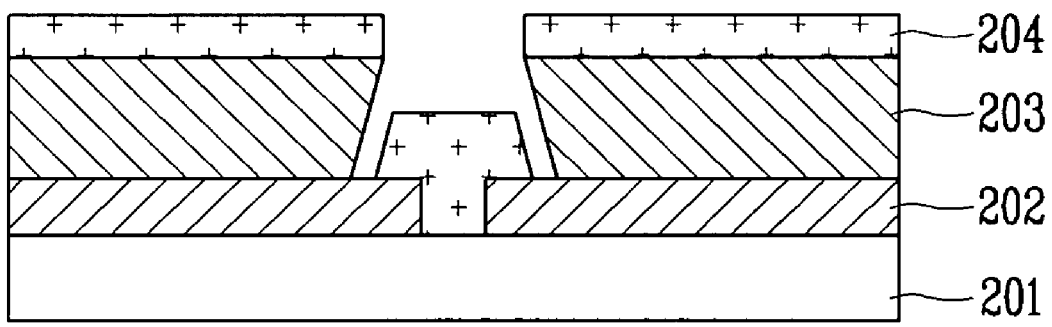
Figure 2F:
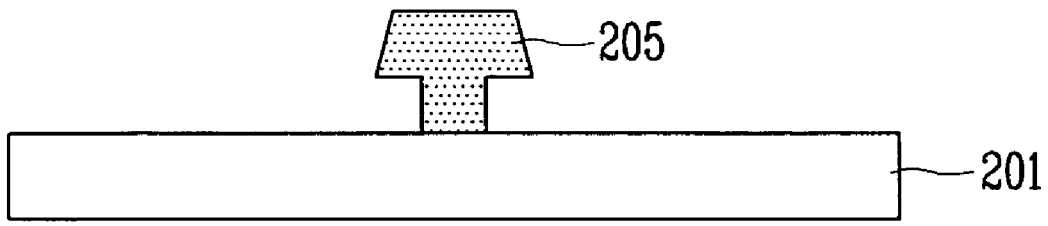
Figure 3:
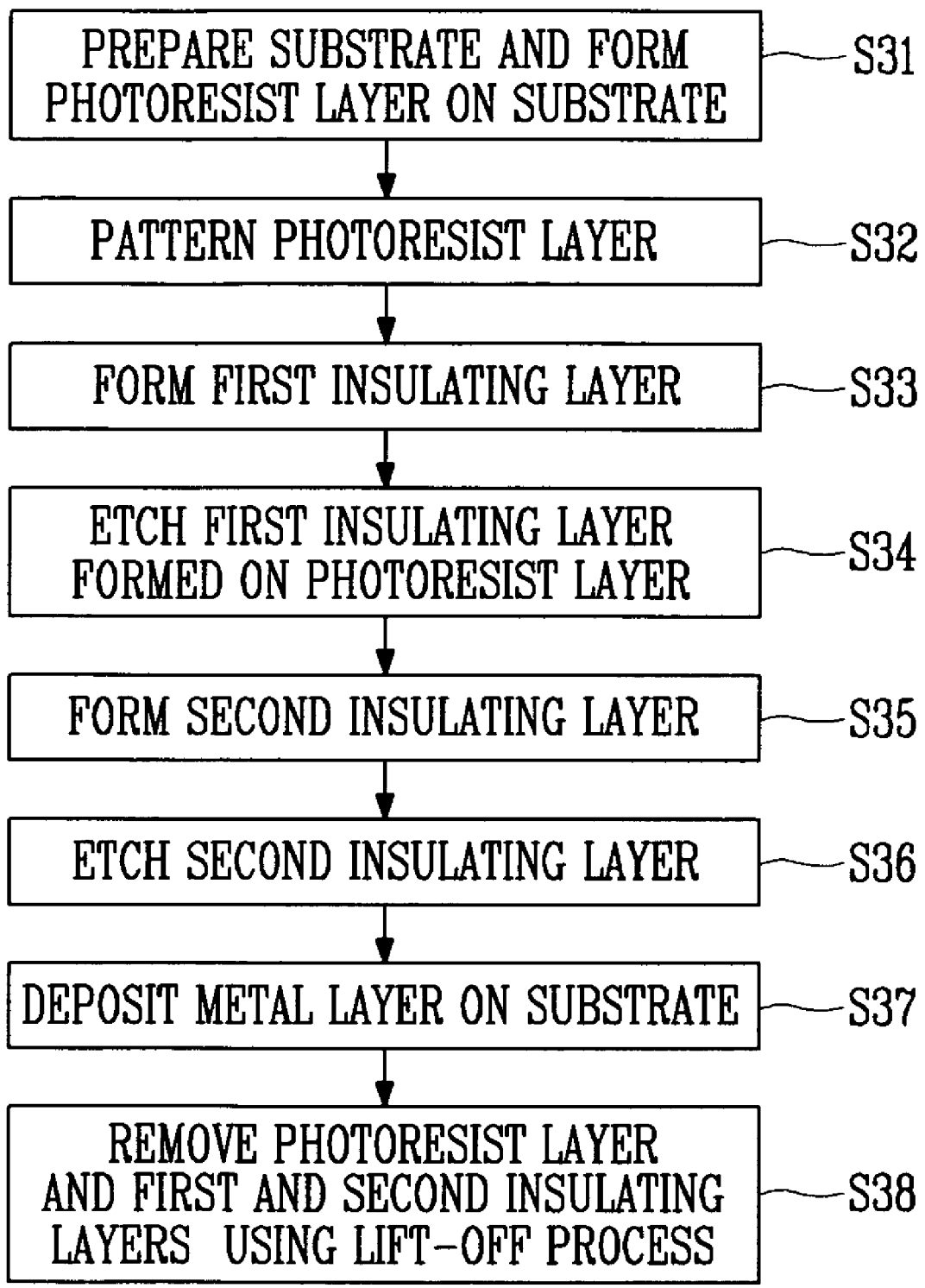
FIG. 3 is a flowchart illustrating a method of fabricating a T-gate according to an exemplary embodiment of the present invention.

FIG. 3 is a flowchart illustrating a method of fabricating a T-gate according to an exemplary embodiment of the present invention. FIGS. 4A to 4H are cross-sectional views illustrating the method of fabricating a T-gate according to the FIG. 3.

Figure 4A:
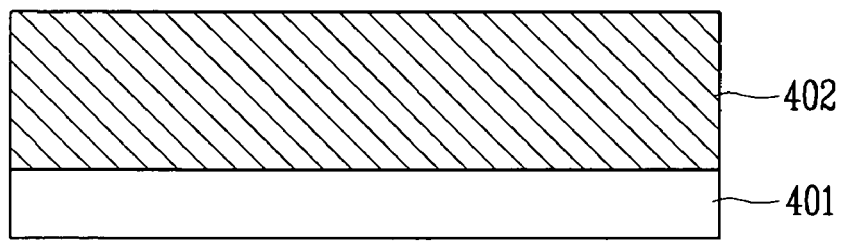
FIGS. 4A to 4H are cross-sectional views illustrating the method of fabricating a T-gate according to the FIG. 3.

Referring to step S31 of FIG. 3 and FIG. 4A, a substrate 401 is prepared, and an image reversal photoresist layer 402 is formed on the substrate 401. After applying the photoresist layer 402 on the substrate 401, a baking process is performed. The photoresist layer 402 may be deposited to a thickness of about 1 μm or more, which is suitable for a lift-off process to be performed later. In this embodiment, AZ5214 is used as the image reversal photoresist layer 402, and applied to a thickness of about 2.4 μm.

Figure 4B:
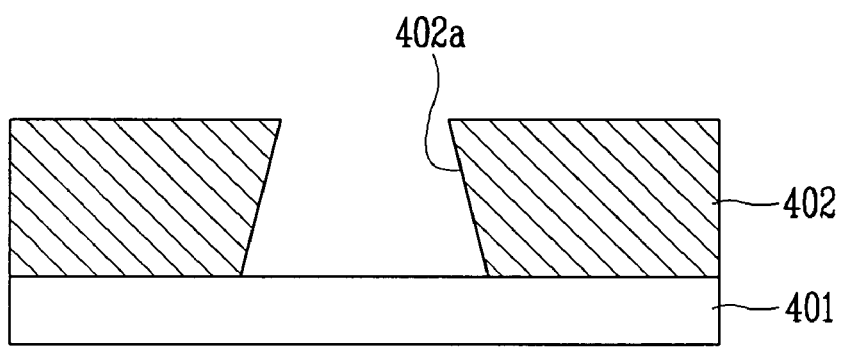

In step S32, the photoresist layer 402 is patterned (referring to FIG. 4B). The photoresist layer 402 is exposed according to a desired pattern and developed using a mask pattern (not shown), and thus the desired pattern is formed. In the embodiment, a first opening 402a is exposed by an image reversal photoresist layer using a trapezoidal pattern. Here, the first opening 402a is formed to have an inverse slope and to a width of about 1.0 μm or less to define a gate of 0.2 μm or less.

Figure 4C:
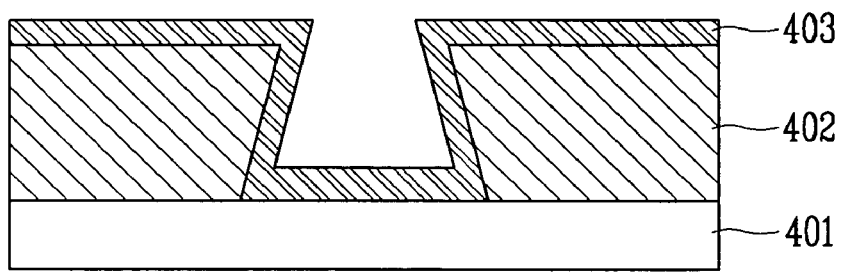

Referring to step S33 of FIG. 3 and FIG. 4C, a first insulating layer 403 is formed on the substrate 401 on which the patterned photoresist layer 402 is applied. The first insulating layer 403 is deposited by low-temperature plasma enhanced chemical vapor deposition (PECVD), which prevents damage of the photoresist layer 402. The first insulating layer 403 may be a silicon nitride layer or a silicon oxide layer, and deposited to a thickness of about 0.2 μm.

Figure 4D:
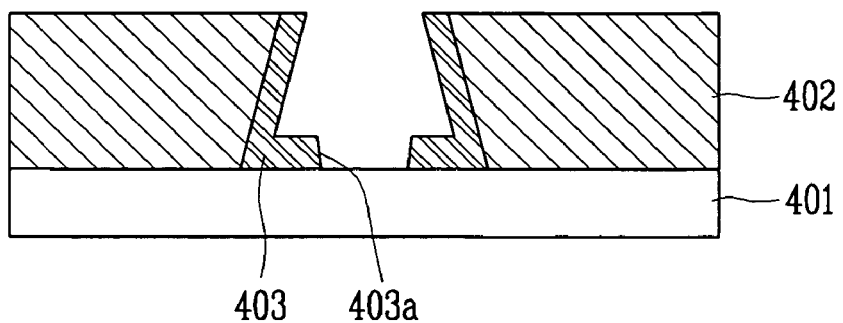

Referring to step S34 of FIG. 3 and FIG. 4D, the first insulating layer 403 is removed. Here, the first insulating layer 403 is blanket-etched by a reactive etching method e.g., a reactive ion etching method. Thereby, the first insulating layer 403 is etched along a pattern of a first opening 402a together with the first insulating layer 403 formed on the photoresist layer 402. Accordingly, the first insulating layer 403 formed on the photoresist layer 402 is removed, and a second opening 403a is formed in the first insulating layer 403 formed in the first opening 402a.

Figure 4E:
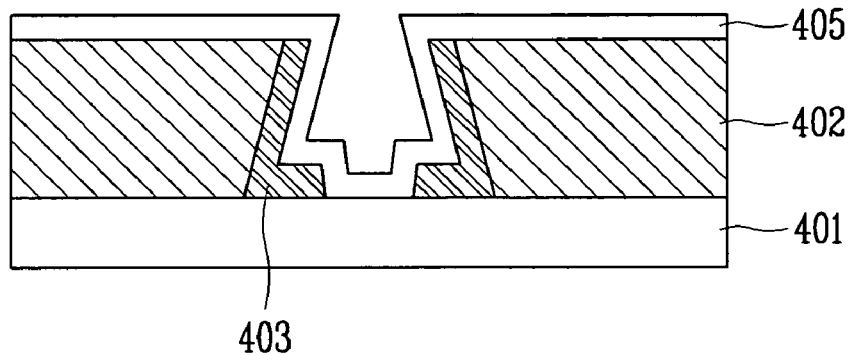

Referring to step S35 of FIG. 3 and FIG. 4E, a second insulating layer 405 is formed on the substrate 401. The second insulating layer 405 is also formed by low-temperature PECVD. The deposition form of the second insulating layer 405 depends on the first or second openings 402a and 403a. The second insulating layer 405 may be a silicon nitride or silicon oxide layer. The length of the gate may be freely controlled by the thickness of the second insulating layer 405. Thus, the second insulating layer 405 has to be formed to a thickness of 0.2 μm or more to define a gate length of 0.2 μm or more.

Figure 4F:
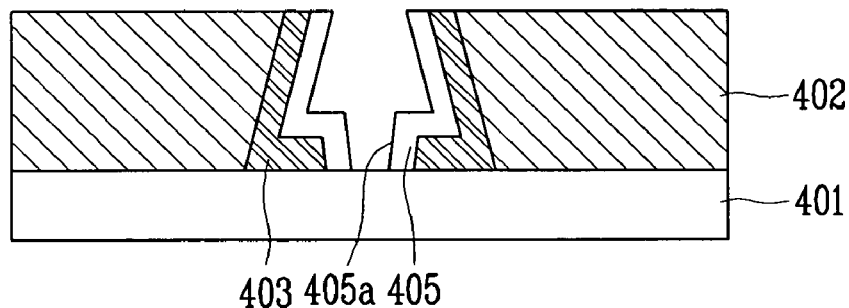

Referring to step S36 of FIG. 3 and FIG. 4F, the second insulating layer 405 is formed, and then blanket-etched by a reactive etching process. When the second insulating layer 405 is etched, as illustrated in FIG. 4F, the second insulating layer 405 formed on the photoresist layer 402 is entirely removed, and then a third opening 405a is formed in the second insulating layer 405 conformally formed on the second opening 403a. Thus, a part of the substrate 401 is exposed. The length of the opening 405a may vary depending on the deposition thicknesses of the first and second insulating layers 403 and 405. That is, the length of the gate leg depends on the thicknesses of the first and second insulating layers 403 and 405, and in this embodiment, is set to be controlled by the thickness of the second insulating layer 405. The gate length may be controlled by controlling the thickness of the second insulating layer 405 through steps S35 and S36. After forming the gate leg, the substrate 401 is recessed to flow desired current between a source and a drain (not illustrated), thereby controlling the current. A wet or dry recess process may be used.

Figure 4G:
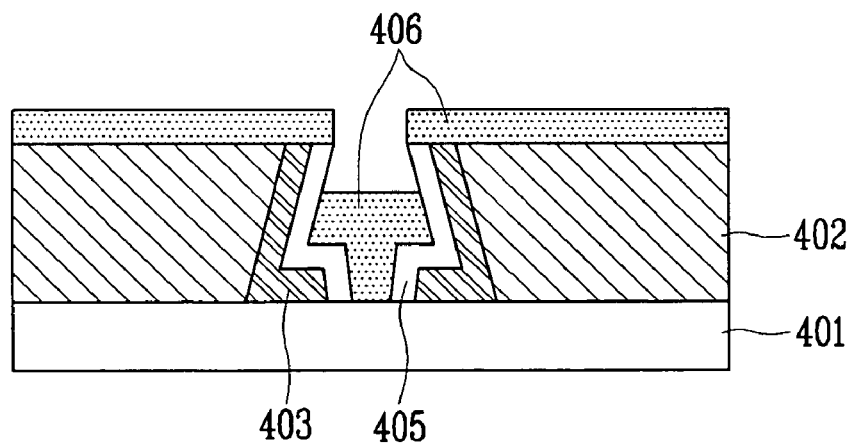

Referring to step S37 of FIG. 3 and FIG. 4G, A metal layer 406 is formed on the photoresist layer 402 and the substrate 401. The metal layer 406 is deposited by an e-beam evaporation method, and in this embodiment, the metal layer 406 may be formed of a metal for a gate electrode composed of titanium/platinum/aluminum (Ti/Pt/Au). The metal layer 406 may be deposited to a thickness of ⅔ of the height from the surface of the second insulating layer 405 inside the gate to the surface of the photoresist layer. In this embodiment, the metal layer 406 is deposited to a thickness of 0.4 μm.

Figure 4H:
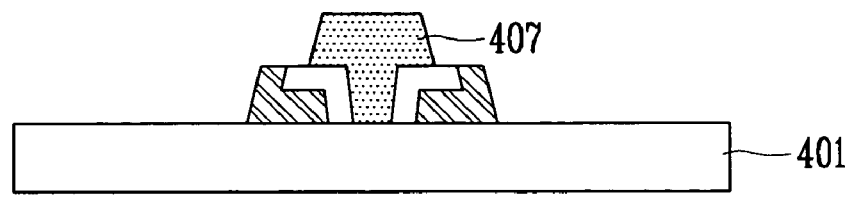

Referring to step S38 of FIG. 3 and FIG. 4H, the metal layer 406 formed on the image reversal photoresist layer 402 is entirely removed by a lift-off process. After that, a T-gate metal layer formed on the substrate 401 only remains, and thus a T-gate electrode 407 is formed.

Figure 5:
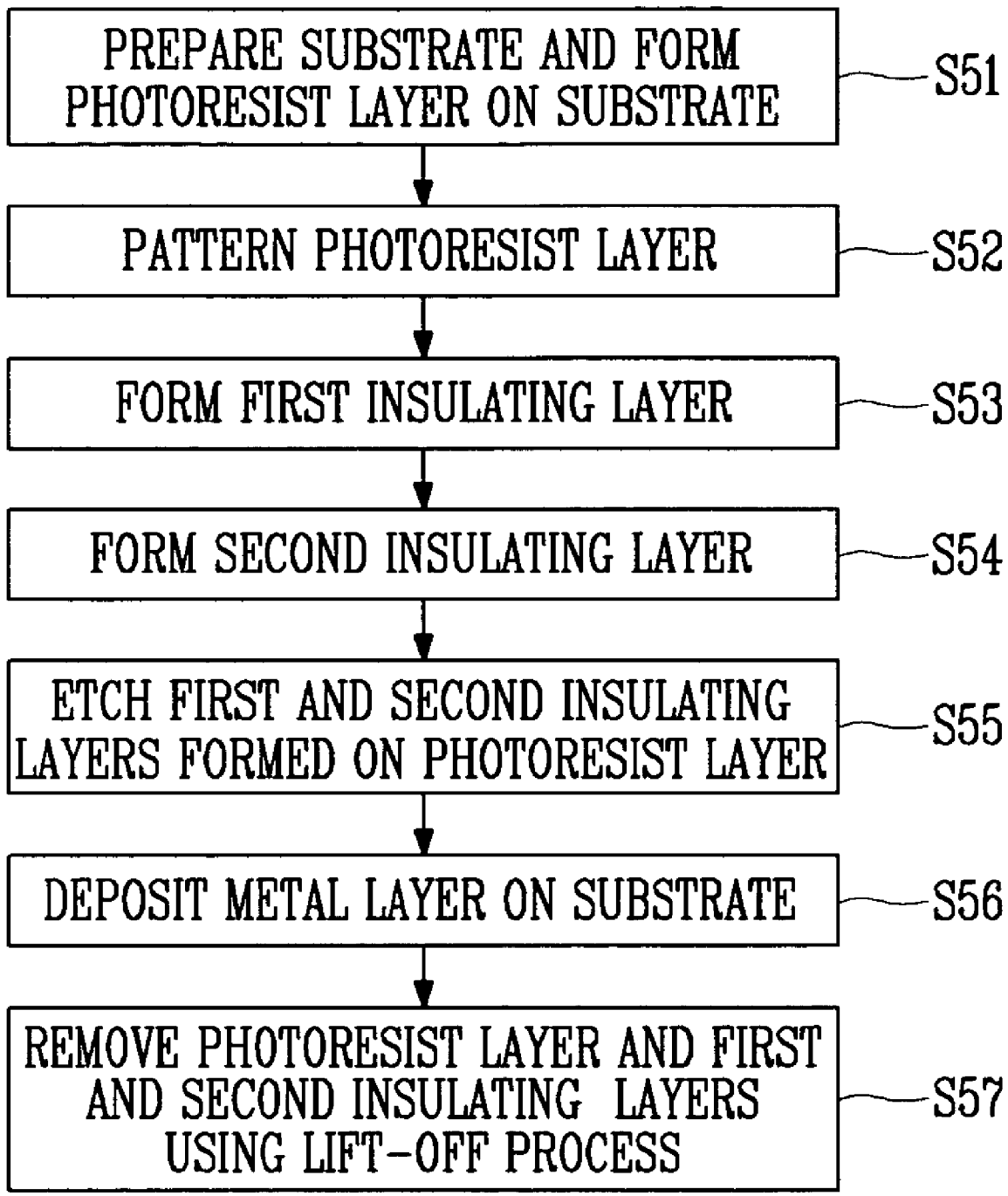
FIG. 5 is a flowchart illustrating a method of fabricating a T-gate according to another exemplary embodiment of the present invention.

FIG. 5 is a flowchart illustrating a method of fabricating a T-gate according to another exemplary embodiment of the present invention, and FIGS. 6A to 6G are cross-sectional views illustrating the method of fabricating a T-gate according to FIG. 5. The repetitive description in FIGS. 3 and 4 will be omitted for convenience of description.

Figure 6A:
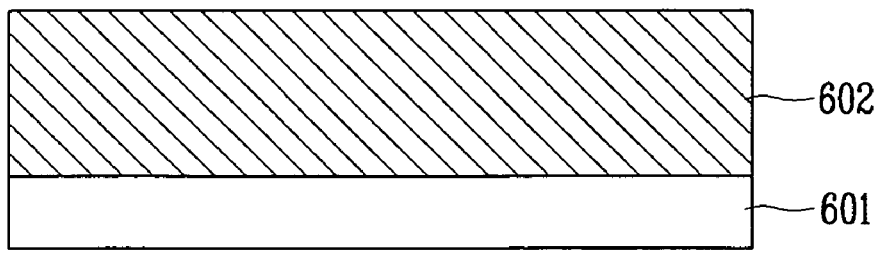
FIGS. 6A to 6G are cross-sectional views illustrating the method of fabricating a T-gate according to FIG. 5.

Referring to step S51 of FIG. 5 and FIG. 6A, first, a substrate 601 is prepared, and an image reversal photoresist layer 602 is formed on the prepared substrate 601. Here, the image reversal photoresist layer 602 may be formed of AZ5214, and applied to a thickness of about 2.4 μm.

Figure 6B:
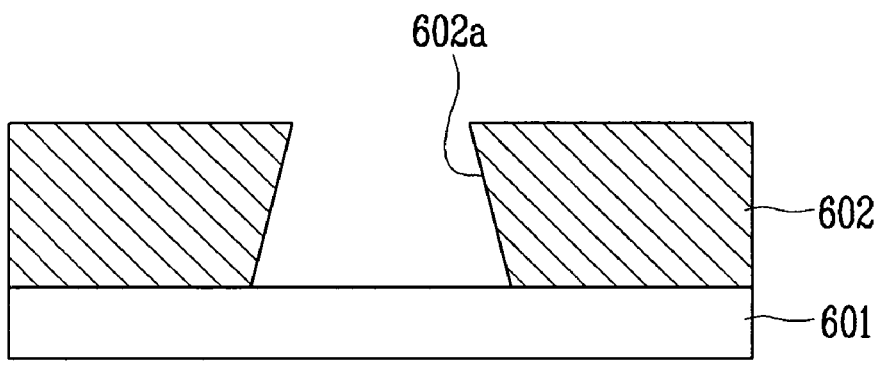

In step S52, the image reversal photoresist layer 602 is patterned (refer to FIG. 6B). The photoresist layer 602 is exposed according to a desired pattern and then sufficiently developed using a mask pattern (not shown), and thus the desired pattern is formed. Here, a first opening 602a is exposed by the image reversal photoresist layer using a trapezoidal pattern. The first opening 602a is formed to have an inverse slop, and to a width of about 1.0 μm or less to define a gate of 0.2 μm or less.

Figure 6C:
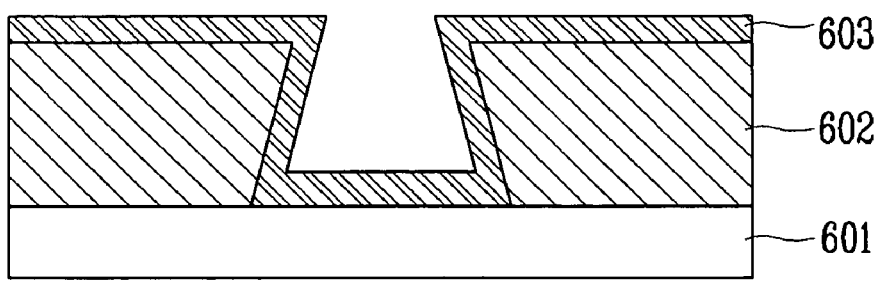
Figure 6D:
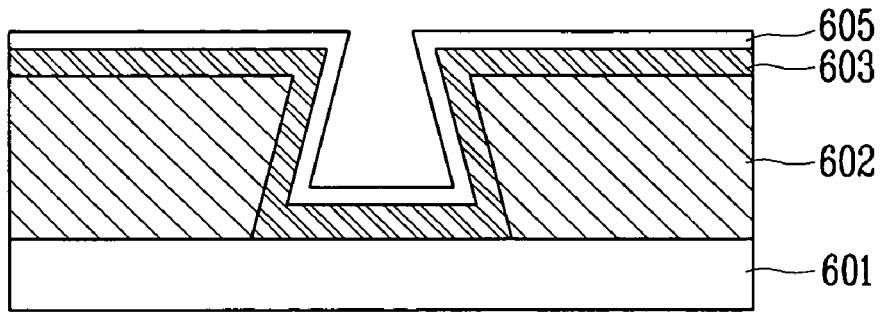
Figure 6E:
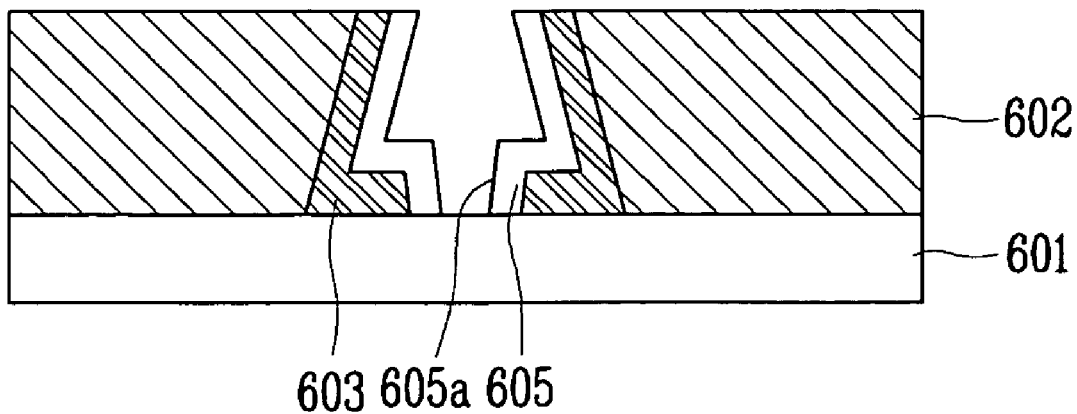

Then, referring to steps S53 and S54 of FIG. 5 and FIGS. 6C and 6D, a first insulating layer 603 is formed on the substrate 601 on which the patterned photoresist layer 602 is applied. A second insulating layer 605 is formed on the first insulating layer 603. The first and second insulating layers 603 and 605 are deposited by low-temperature PECVD, which prevents damage of the photoresist layer 602. The first and second insulating layers 603 and 605 may be a silicon nitride or silicon oxide layer. And, the first insulating layer 603 is deposited to a thickness of about 0.2 μm. Here, the length of a gate may be freely controlled by controlling the thickness of the second insulating layer 605. Accordingly, the second insulating layer 605 has to be formed to a thickness of 0.2 μm or more to define a gate length of 0.2 μm or more.

Referring to step S55 of FIG. 5 and FIG. 6D, the first and second insulating layers 603 and 605 are blanket-etched by a reactive etching method, e.g., a reactive ion etching method. Thereby, the first and second insulating layers 603 and 605 formed on the photoresist layer 602 are sequentially etched along a pattern of the first opening 602a. Accordingly, the first and second insulating layers 603 and 605 formed on the photoresist layer 602 are sequentially removed, and the first and second insulating layers 603 and 605 formed in the first opening 402a are also removed. Thus, a second opening 605a is formed. The length of the second opening 605a may vary according to the deposition thicknesses of the first and second insulating layers 603 and 605. That is, the length of the gate leg depends on the thicknesses of the first and second insulating layers 603 and 605. In the present embodiment, the first and second insulating layers 603 and 605 are sequentially etched, that is, etched in reverse of the deposition sequence. However, it is apparent that the first and second insulating layers 603 and 605 may be simultaneously etched.

Figure 6F:
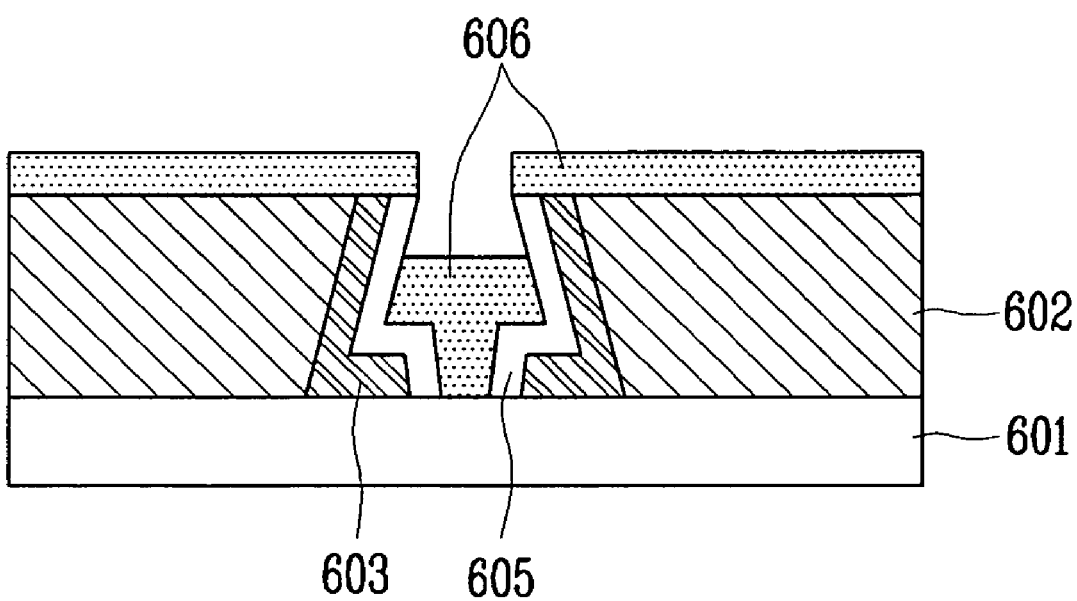

Referring to step S56 of FIG. 5 and FIG. 6F. A metal layer 606 is formed on the photoresist layer 602 and the substrate 601. The metal layer 606 is deposited by an e-beam evaporation method, and in the present embodiment, the metal layer 606 may be formed of a metal for a gate electrode composed of Ti/Pt/Au. The metal layer 606 may be deposited to a thickness of ⅔ of the height from the surface of the second insulating layer 605 inside the gate to the surface of the photoresist layer. In this embodiment, the metal layer 606 may be deposited to a thickness of 0.4 μm.

Figure 6G:
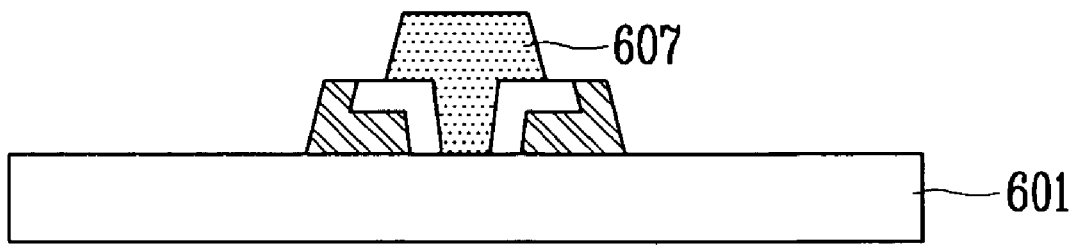

Referring to step S57 of FIG. 5 and FIG. 6G, the metal layer 606 formed on the image reversal photoresist layer 602 is entirely removed by a lift-off process. After that, only a T-shaped metal layer formed on the substrate 601 remains, and thus a T-gate electrode 607 is formed.

According to the present invention, an opening is defined using an image reversal photoresist layer, and then the opening defining the length of a gate may be uniformly and elaborately formed through deposition of an insulating layer and a blanket dry etching process. As a result, a more elaborate micro T-gate electrode may be fabricated.

Also, when a head of the T-gate is exposed, e-beam lithography is not used, and thus production cost may be reduced and productivity may be improved.

While the present invention has been shown and described with reference to certain exemplary embodiments thereof, it will be understood by those skilled in the art that various changes in form and details may be made therein without departing from the spirit and scope of the present invention as defined by the appended claims.

What is claimed is:

1. A method of fabricating a T-gate, comprising the steps of:
   forming a photoresist layer on a substrate;
   patterning the photoresist layer formed on the substrate and forming a first opening;
   forming a first insulating layer on the photoresist layer and the substrate;
   removing the first insulating layer and forming a second opening to expose the substrate;
   forming a second insulating layer on the first insulating layer;
   removing the second insulating layer and forming a third opening to expose the substrate;
   forming a metal layer on the second insulating layer on which the photoresist layer and the third opening are formed; and
   removing the metal layer formed on the photoresist layer.

2. The method according to claim 1, wherein the step of patterning the photoresist layer comprises the steps of exposing the photoresist layer so that the first opening has an inverse slope using a photolithography method, and developing the exposed photoresist layer.

3. The method according to claim 1, wherein the step of removing the metal layer formed on the photoresist layer is performed by removing the photoresist layer and the first and second insulating layers by a lift-off process.

4. The method according to claim 1, wherein the photoresist layer is formed of an image reversal photoresist layer.

5. The method according to claim 4, wherein the first opening formed in the photoresist layer is patterned to a width of about 1 μm or less.

6. The method according to claim 1, wherein the step of forming the second opening in the first insulating layer is performed by etching the first insulating layer by a reactive etching process.

7. The method according to claim 1, wherein the step of forming the third opening in the second insulating layer is performed by etching the second insulating layer by a reactive etching process.

* * * * *